United States Patent
Chen (10) Patent No.: US 10,291,258 B2
(45) Date of Patent: May 14, 2019

(54) ERROR CORRECTING CODE FOR CORRECTING SINGLE SYMBOL ERRORS AND DETECTING DOUBLE BIT ERRORS

(71) Applicant: Advanced Micro Devices, Inc., Sunnyvale, CA (US)

(72) Inventor: Chin-Long Chen, South Windsor, CT (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/605,310

(22) Filed: May 25, 2017

(65) Prior Publication Data
US 2018/0343018 A1    Nov. 29, 2018

(51) Int. Cl.
*H03M 13/11*     (2006.01)
*H03M 13/00*     (2006.01)
(Continued)

(52) U.S. Cl.
CPC ..... *H03M 13/1174* (2013.01); *H03M 13/033* (2013.01); *H03M 13/07* (2013.01); *H03M 13/134* (2013.01); *H03M 13/1505* (2013.01); *H03M 13/19* (2013.01); *H03M 13/616* (2013.01)

(58) Field of Classification Search
CPC ............. H03M 13/1174; H03M 13/07; H03M 13/1505; H03M 13/616
See application file for complete search history.

(56) References Cited

U.S. PATENT DOCUMENTS 4,486,882 A * 12/1984 Piret .................. G11B 20/1813
                                                                                    714/788
5,864,569 A * 1/1999 Roohparvar ........ G06F 11/1072
                                                                       365/185.03
(Continued)

OTHER PUBLICATIONS

International Search Report and Written Opinion in International Application No. PCT/US2018/034598, dated Aug. 16, 2018, 16 pages.
(Continued)

*Primary Examiner* — Kyle Vallecillo
(74) *Attorney, Agent, or Firm* — Meyertons Hood Kivlin Kowert and Goetzel PC; Rory D. Rankin (57) ABSTRACT

Systems, apparatuses, and methods for generating error correction codes (ECCs) with two check symbols are disclosed. In one embodiment, a system receives a data word of length N−2 symbols, wherein N is a positive integer greater than 2, wherein each symbol has m bits, and wherein m is positive integer. The system generates a code word of length N symbols from the data word in accordance with a linear code defined by a parity check matrix. The parity check matrix is generated based on powers of γ, wherein γ is equal to β raised to the $(2^{m/4}-1)$ power, β is equal to α raised to the $(2^{m/2}+1)$ power, and α is a primitive element of $GF(2^m)$. In another embodiment, the system receives a (N, N−2) code word and decodes the code word by generating a syndrome S from the code word using the parity check matrix.

24 Claims, 9 Drawing Sheets

(51) Int. Cl.
*H03M 13/15* (2006.01)
*H03M 13/07* (2006.01)
*H03M 13/03* (2006.01)
*H03M 13/13* (2006.01)
*H03M 13/19* (2006.01)

(56) References Cited

U.S. PATENT DOCUMENTS

| | | | |
|---|---|---|---|
| 6,092,182 A | 7/2000 | Mahalingaiah | |
| 6,804,799 B2 | 10/2004 | Zuraski, Jr. | |
| 6,934,903 B1 | 8/2005 | Keltcher et al. | |
| 7,043,679 B1 | 5/2006 | Keltcher et al. | |
| 8,135,935 B2 | 3/2012 | Haertel et al. | |
| 2007/0011601 A1* | 1/2007 | Griseta | G06F 11/1072 714/805 |
| 2011/0029845 A1* | 2/2011 | Zhou | H03M 13/1171 714/776 |
| 2017/0250713 A1* | 8/2017 | Langhammer | H03M 13/1515 |

OTHER PUBLICATIONS

Fujiwara et al., "Single b-Bit Byte Error Correcting and Double Bit Error Detecting Codes for High-Speed Memory Systems", Digest of Papers of the 1992 IEEE Workshop on Fault-Tolerant Parallel and Distributed Systems, Jul. 6, 1992, pp. 494-501.

Patel, Arvind M., "Error Recovery Scheme for the IBM 3850 Mass Storage System", IBM Journal of Research and Development, Jan. 1, 1980, pp. 32-42, vol. 24, Issue 1, IBM.

* cited by examiner

$$H = \begin{bmatrix} 1 & 1 & 1 & \cdots & 1 & \cdots & 1 & 1 & 0 \\ 1 & \alpha & \alpha^2 & \cdots & \alpha^i & \cdots & \alpha^{2^{(m)}-2} & 0 & 1 \end{bmatrix} \leftarrow 505$$

FIG. 5

$$H = \begin{bmatrix} 1 & 1 & 1 & & 1 & 1 & 1 \\ \beta & \beta^2 & \cdots & \beta^i & \cdots & \beta^{2^{\wedge}(m/2)-2} & 0 & 1 \end{bmatrix} \quad \longleftarrow 605$$

FIG. 6

$$H = \begin{bmatrix} 1 & 1 & \cdots & 1 & \cdots & 1 \\ \gamma_1 & \gamma_2 & & \gamma_i & & \gamma_N \end{bmatrix} \quad \longleftarrow 705$$

$$H = \begin{bmatrix} 1 & 1 & \cdots & 1 & \cdots & 1 & 1 & 1 \\ \gamma & \gamma^2 & & \gamma^i & & \gamma^{2^{\wedge}(m/4)} & 0 & 1 \end{bmatrix} \quad \longleftarrow 710$$

$$H = \begin{bmatrix} 1 & 1 & \cdots & 1 & \cdots & 1 & 1 & 1 & 1 \\ \gamma & \gamma^2 & & \gamma^i & & \gamma^{2^{\wedge}(m/4)} & \beta & 0 & 1 \end{bmatrix} \quad \longleftarrow 715$$

$$H = \begin{bmatrix} 1 & 1 & \cdots & 1 & \cdots & 1 & 1 & 1 & 1 \\ \gamma & \gamma^2 & & \gamma^i & & \gamma^{16} & \beta & 0 & 1 \end{bmatrix} \quad \longleftarrow 720$$

$$H = \begin{vmatrix} H_{1i} \\ H_{2i} \end{vmatrix} = \begin{vmatrix} 1 \\ H_{2i} \end{vmatrix} \quad \longleftarrow 725$$

ERROR CORRECTING CODE FOR CORRECTING SINGLE SYMBOL ERRORS AND DETECTING DOUBLE BIT ERRORS

BACKGROUND

Description of the Related Art

Error correction codes (ECCs) are commonly used in digital communication and data storage. An ECC can be constructed to detect and correct errors in a block of encoded data words. In constructing an ECC, a block of r redundant bits, called check bits, is attached to a block of k data bits to form an encoded ECC code word of n bits, where n=k+r is the length of the code. The ECC is commonly called an (n, k) code. For an ECC designed to detect and correct symbol oriented errors, the ECC words are divided into symbols of m-bit size. As used herein, the term "symbol" is defined as a collection of one or more bits which are treated as a single unit. The number of bits in a symbol is referred to as "m" bits throughout this disclosure. In one embodiment, the number of bits in a symbol corresponds to the number of bits of a memory chip. The symbol ECC having K data symbols and R check symbols is an (n, k) code, where n=m(K+R), and k=mK. The symbol ECC is also called an (N, K) code, where N=n/m is the code length in number of symbols.

Codes can be classified based on their ability to correct a certain number of symbol errors and their ability to detect a particular number of bit errors. For example, a certain class of codes are designated as single symbol error correcting and double bit error detecting codes. A single symbol error correcting and double bit error detecting code is defined as a code that is able to correct any single-symbol error in a code word while also detecting any double-bit error in the code word. A bit error is generated if a device failure changes the value of one data bit only. A single-symbol error is defined as any 1 to m erroneous bits within a single symbol. A double-bit error is defined as a single-bit error in a first symbol and a single-bit error in a second symbol, where the second symbol is different from the first symbol.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for generating error correction codes (ECCs) with two check symbols are disclosed. In one embodiment, a system receives a data word of length N−2 symbols, where N is a positive integer greater than 2, where each symbol has m bits, and where m is positive integer. The system generates a code word of length N symbols from the data word in accordance with a linear code defined by a parity check matrix. The parity check matrix is generated based on powers of $\gamma$, where $\gamma$ is equal to $\beta$ raised to the $(2^{m/4}-1)$ power, $\beta$ is equal to $\alpha$ raised to the $(2^{m/4}+1)$ power, and $\alpha$ is a primitive element of Galois Field $GF(2^m)$. In another embodiment, the system receives a (N, N−2) code word and decodes the code word by generating a syndrome S from the code word using the parity check matrix. The system utilizes the generated syndrome S to determine if the code word has any errors and to correct the errors if the errors are correctable.

In one embodiment, a (19, 17) symbol ECC is constructed for use in the storage and/or transmission of data by one or more computing devices. In the (19, 17) symbol ECC, there are m bits per symbol. In one embodiment, m is 16, and there are 16 bits per symbol. In other embodiments, m can be equal to other numbers of bits. For the (19, 17) symbol ECC, there are 17 data symbols and 2 check symbols in a code word. Alternatively, the ECC can be referred to as a (304, 272) code in bits for the embodiment when m=16. In this embodiment, the ECC detects and corrects all single symbol errors in a code word. Also, in this embodiment, the ECC detects all double bit errors in a code word.

In one embodiment, a (18, 16) symbol ECC is constructed for use in the storage and/or transmission of data by one or more computing devices. In the (18, 16) symbol ECC, there are m bits per symbol. In one embodiment, m is 16, and there are 16 bits per symbol. In other embodiments, m can be equal to other numbers of bits. For the (18, 16) symbol ECC, there are 16 data symbols and 2 check symbols in a code word. Alternatively, the ECC can be referred to as a (288, 256) code in bits for the embodiment when m=16. In this embodiment, the ECC detects and corrects all single symbol errors in a code word. Also, in this embodiment, the ECC detects and corrects all double bit errors in a code word.

Figure 1:
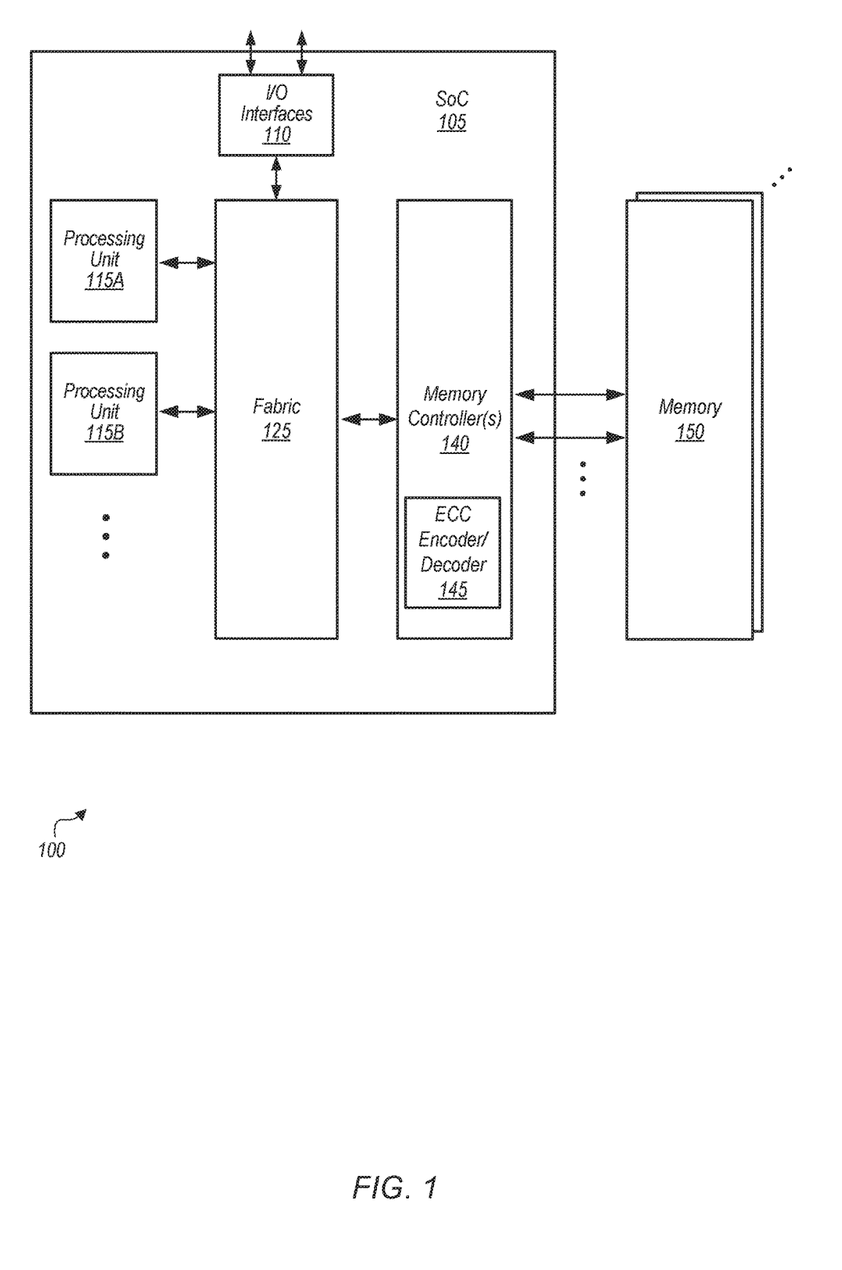
FIG. 1 is a block diagram of one embodiment of a computing system.

Referring now to FIG. 1, a block diagram of one embodiment of a computing system 100 is shown. In one embodiment, computing system 100 includes system on chip (SoC) 105 coupled to memory 150. SoC 105 can also be referred to as an integrated circuit (IC). In one embodiment, SoC 105 includes processing units 115A-B, input/output (I/O) interfaces 110, fabric 125, and memory controller(s) 140. SoC 105 can also include other components not shown in FIG. 1 to avoid obscuring the figure. Processing units 115A-B are representative of any number and type of processing units.

In one embodiment, processing units 115A-B are central processing unit (CPU) cores. In another embodiment, one or more of processing units 115A-B are other types of processing units (e.g., graphics processing unit (GPU), application specific integrated circuit (ASIC), field programmable gate array (FPGA), digital signal processor (DSP)).

In one embodiment, processing units 115A-B are configured to execute instructions of a particular instruction set architecture (ISA). Each processing unit 115A-B includes one or more execution units, cache memories, schedulers, branch prediction circuits, and so forth. In one embodiment, the processing units 115A-B are configured to execute the main control software of system 100, such as an operating system. Generally, software executed by processing units 115A-B during use can control the other components of system 100 to realize the desired functionality of system 100. Processing units 115A-B can also execute other software, such as application programs. The software instructions executed by processing units 115A-B include memory requests targeting memory locations in memory 150.

Memory requests which traverse memory controller(s) 140 can pass through error correction code (ECC) encoder/decoder 145. In one embodiment, ECC encoder/decoder 145 is configured to generate check symbols for data being written to memory. ECC encoder/decoder 145 is configured to generate the check symbols from the data using a parity check matrix. In one embodiment, ECC encoder/decoder 145 generates a (N, N−2) code which includes 2 check symbols for N−2 data symbols. In one embodiment, ECC encoder/decoder 145 utilizes a parity check matrix to generate the (N, N−2) code, where the parity check matrix is generated based on powers of $\gamma$, where $\gamma$ is equal to $\beta$ raised to the $(2^{m/4}-1)$ power, $\beta$ is equal to $\alpha$ raised to the $(2^{m/2}+1)$ power, and a is a primitive element of $GF(2^m)$, where m is the number of bits per symbol.

ECC encoder/decoder 145 is also configured to decode data read from memory and to verify that the check symbols match the retrieved data symbols. In one embodiment, ECC encoder/decoder 145 is configured to generate a syndrome from the retrieved data and the parity check matrix. As used herein, the term "syndrome" refers to a vector that results from the multiplication of a received code word by a parity check matrix. For example, a syndrome of (n−k) bits is the result of the multiplication of a parity check matrix of dimension (n−k) by n and a received code word of length n. If the syndrome is zero, the ECC encoder/decoder 145 treats the retrieved data as if it has no errors. Otherwise, if the syndrome is non-zero, the ECC encoder/decoder 145 utilizes the syndrome to correct the error(s) or ECC encoder/decoder 145 generates an uncorrectable error (UE) indicator if the error(s) cannot be corrected.

In one embodiment, ECC encoder/decoder 145 generates (N, N−2) code words from data of symbol length=N−2. In one embodiment, ECC encoder/decoder 145 generates (18, 16) code words. In another embodiment, ECC encoder/decoder 145 generates (19,17) code words. In other embodiments, ECC encoder/decoder 145 generates other types of code words. In one embodiment, the (N, N−2) code words generated by ECC encoder/decoder 145 are single-symbol error correcting and double-bit error correcting code words. In another embodiment, the (N, N−2) code words generated by ECC encoder/decoder 145 are single-symbol error correcting and double-bit error detecting code words.

It is noted that ECC encoder/decoder 145 can be utilized in other locations within SoC 105 other than within memory controller(s) 140. For example, ECC encoder/decoder 145 can be located within a given processing unit 115 and utilized when the given processing unit 115 is accessing a local cache. Depending on the embodiment, ECC encoder/decoder 145 can be implemented using any suitable combination of hardware and/or software.

I/O interfaces 110 are coupled to fabric 125, and I/O interfaces 110 are representative of any number and type of interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices can be coupled to I/O interfaces 110. Such peripheral devices include (but are not limited to) displays, keyboards, mice, printers, scanners, joysticks or other types of game controllers, media recording devices, external storage devices, network interface cards, and so forth.

SoC 105 is coupled to memory 150, which includes one or more memory modules. Each of the memory modules includes one or more memory devices mounted thereon. In some embodiments, memory 150 includes one or more memory devices mounted on a motherboard or other carrier upon which SoC 105 is also mounted. In one embodiment, memory 150 is used to implement a random-access memory (RAM) for use with SoC 105 during operation. The RAM implemented can be static RAM (SRAM), dynamic RAM (DRAM), Resistive RAM (ReRAM), Phase Change RAM (PCRAM), or any other volatile or non-volatile RAM. The type of DRAM that is used to implement memory 150 includes (but is not limited to) double data rate (DDR) DRAM, DDR2 DRAM, DDR3 DRAM, and so forth. Although not explicitly shown in FIG. 1, SoC 105 can also include one or more cache memories that are internal to the processing units 115A-B.

In various embodiments, computing system 100 can be a computer, laptop, mobile device, server or any of various other types of computing systems or devices. It is noted that the number of components of computing system 100 and/or SoC 105 can vary from embodiment to embodiment. There can be more or fewer of each component/subcomponent than the number shown in FIG. 1. For example, in another embodiment, SoC 105 can include multiple memory controllers coupled to multiple memories. It is also noted that computing system 100 and/or SoC 105 can include other components not shown in FIG. 1. Additionally, in other embodiments, computing system 100 and SoC 105 can be structured in other ways than shown in FIG. 1.

Figure 2:
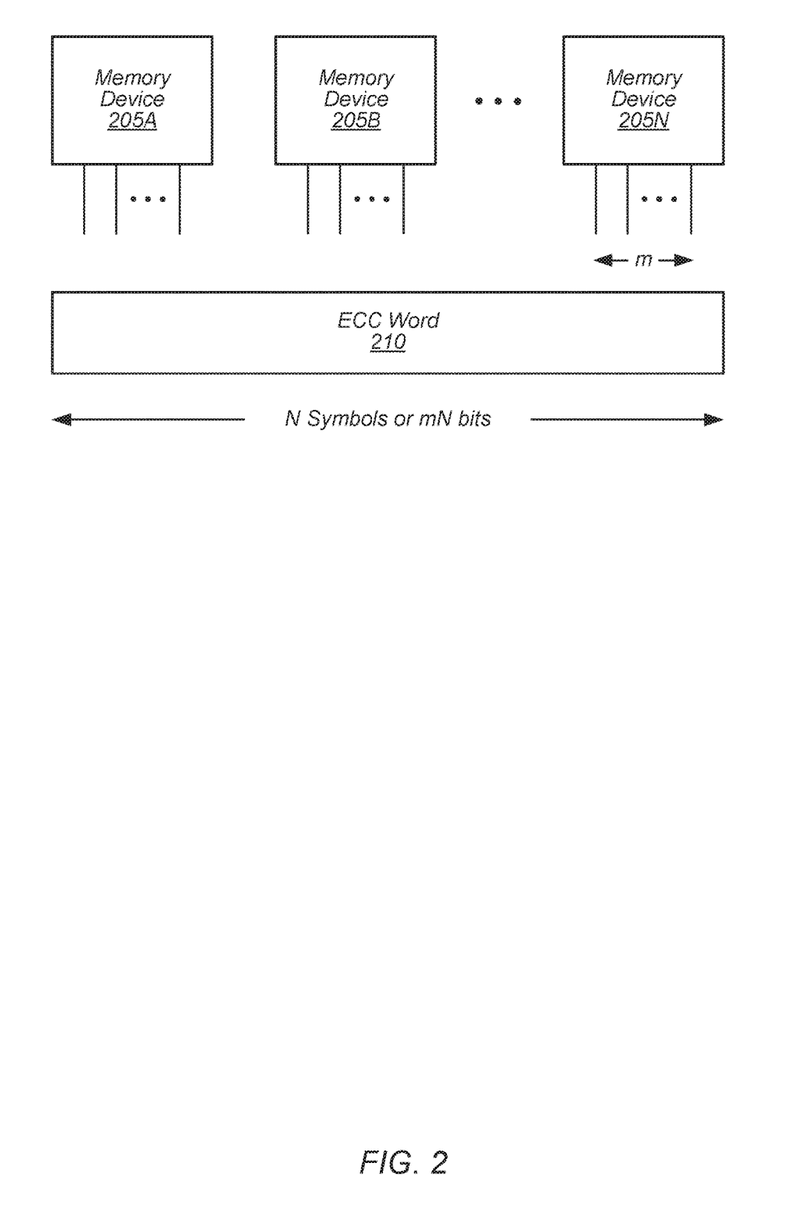
FIG. 2 is a block diagram of one embodiment of the generation of error correction code (ECC) word.

Turning now to FIG. 2, a block diagram of one embodiment of the generation of error correction code (ECC) word 210 is shown. In one embodiment, a memory bus includes memory devices 205A-N. The number N of memory devices 205A-N can vary from embodiment to embodiment. Each memory device includes m bits, where the value of m can vary from embodiment to embodiment. An ECC encoder (e.g., ECC encoder/decoder 145 of FIG. 1) is configured to generate ECC word 210 which includes N symbols with each symbol including m bits, for a total of m*N bits.

In another embodiment, ECC word 210 can include an additional symbol which does not get stored to memory devices 205A-N. For example, in this embodiment, ECC word 210 can include an extra symbol which is generated based on the address of the memory request. The extra symbol is not stored in memory devices 205A-N, but the value of this extra symbol is embedded in the check symbols generated as part of ECC word 210. For example, in one embodiment, N is equal to 19, and ECC word 210 includes 19 symbols, with 2 check symbols generated for 17 data symbols. In this embodiment, 16 of the data symbols correspond to actual data, and the $17^{th}$ data symbol includes extra information (e.g., address parity). In this embodiment, the ECC encoder generates 2 check symbols to create a (19, 17) code word. The 16 data symbols and 2 check symbols can then be stored to memory devices 205A-N.

Figure 3:
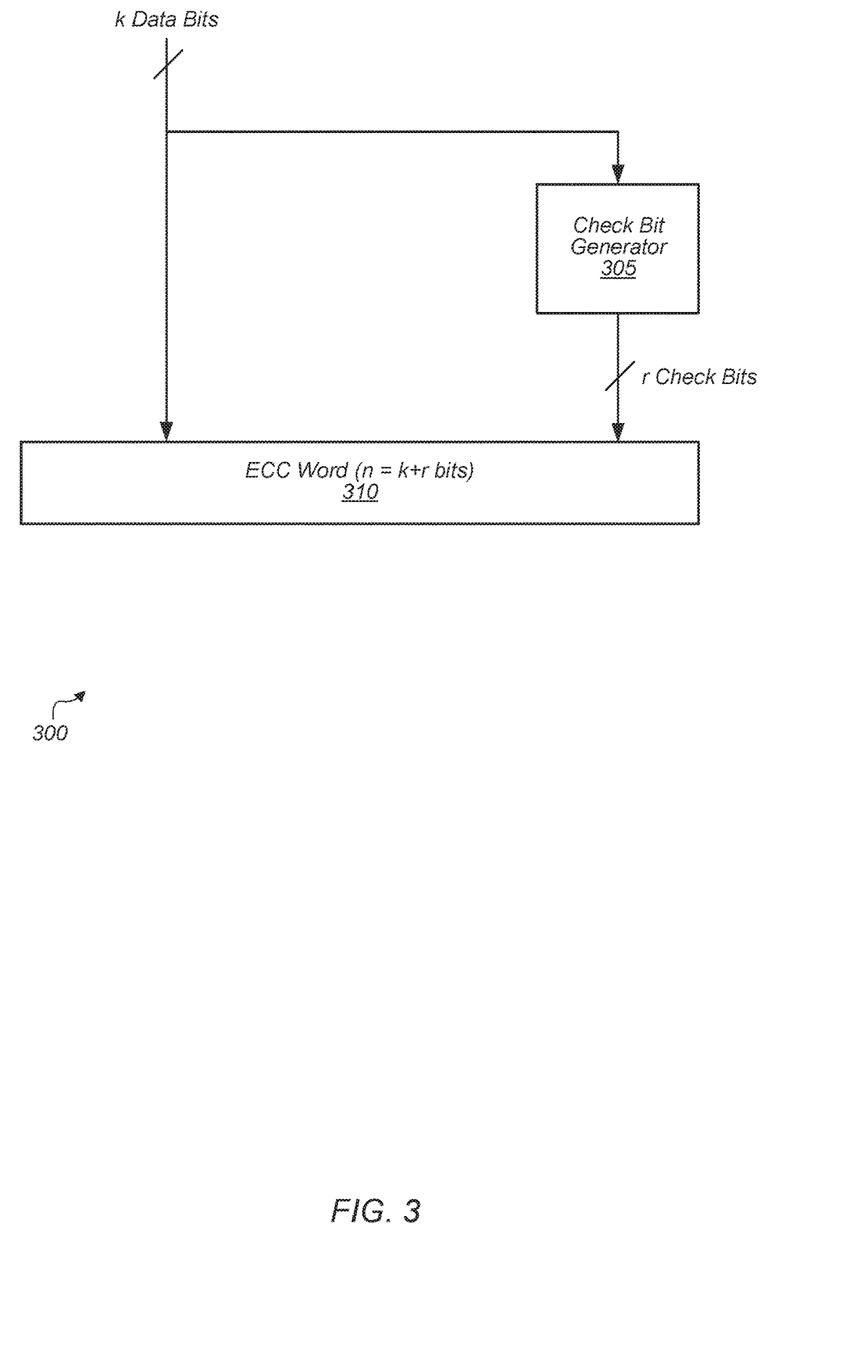
FIG. 3 is a block diagram of one embodiment of an ECC encoder.

Referring now to FIG. 3, a block diagram of one embodiment of an ECC encoder 300 is shown. In one embodiment, ECC encoder 300 includes check bit generator 305 which receives k data bits to generate r check bits. Accordingly, ECC word 310 includes a total of n bits where n=k+r bits. In one embodiment, the value of a check bit is obtained by an exclusive-OR (XOR) logic operation on certain selected data bits, depending on the corresponding row vector in the parity check matrix. Example techniques for generating the parity check matrix are described in more detail later in this disclosure. The XOR operations for generating check bits can be derived using companion matrices in carrying out multiplications of finite field elements.

Figure 4:
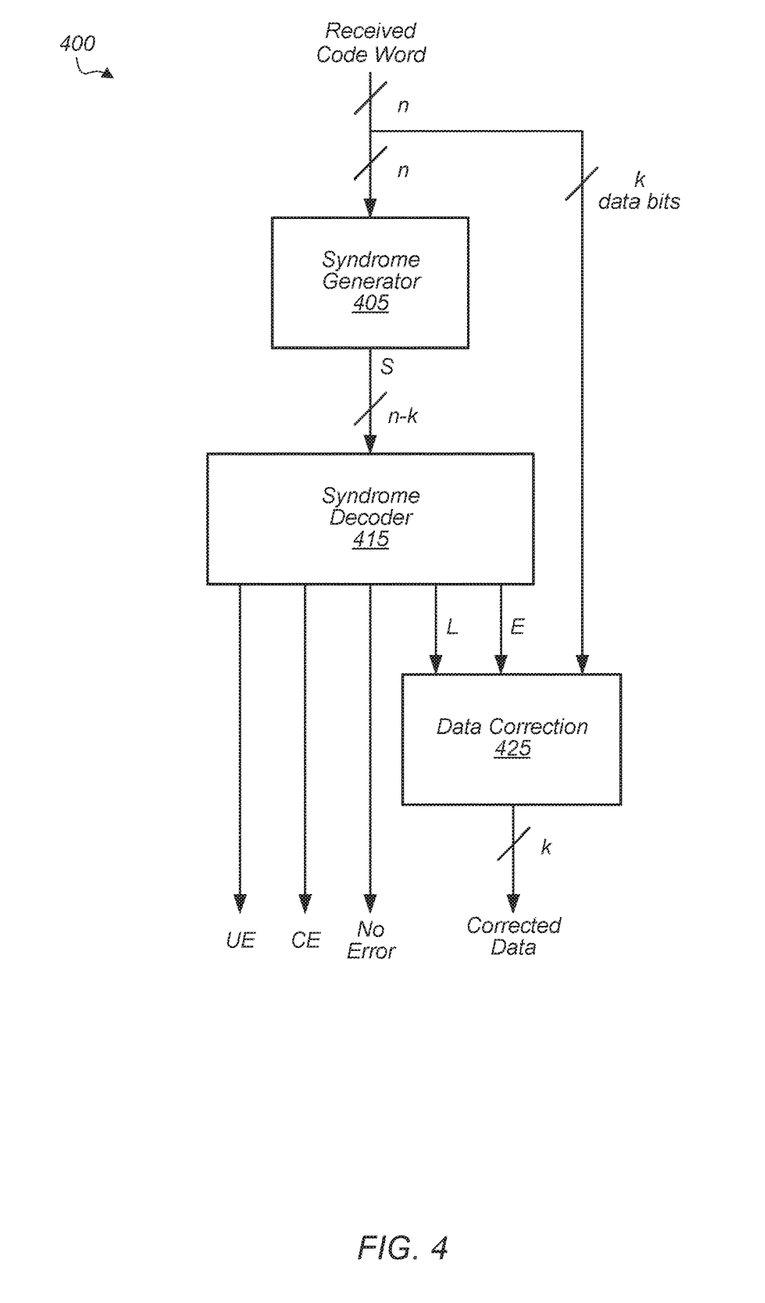
FIG. 4 is a block diagram of an ECC decoder.

Turning now to FIG. 4, a block diagram of one embodiment of an ECC decoder 400 is shown. The received code word of length n bits is received by syndrome generator 405. In one embodiment, the received code word is retrieved from one or more memory devices. In another embodiment, the received code word is received on a communication bus. Also, the k data bits are conveyed to data correction unit 425. The k data bits are the data bits of the received word of length n bits without the (n−k) check bits.

Syndrome generator 405 is configured to generate the syndrome S from the received code word. The syndrome S has a length of 2m bits, where m is the width of each symbol in the code word. This assumes the received code word includes 2 check symbols. In other embodiments, for code words with other numbers of check symbols, the syndrome can have other numbers of bits.

The syndrome S is conveyed to syndrome decoder 415. Syndrome decoder 415 is configured to generate the uncorrectable error (UE), correctable error (CE), and no error signals based on the value of the input syndrome S. Syndrome decoder 415 also identifies the location of a correctable error and conveys the location (L) to data correction unit 425 along with the error (E). Data correction unit 425 utilizes the location and error to correct the error indicated by syndrome decoder 415 and then data correction unit 425 outputs the corrected data. Syndrome generator 405, syndrome decoder 415, and data correction unit 425 can be implemented using any suitable combination of hardware and/or software.

Figure 5:
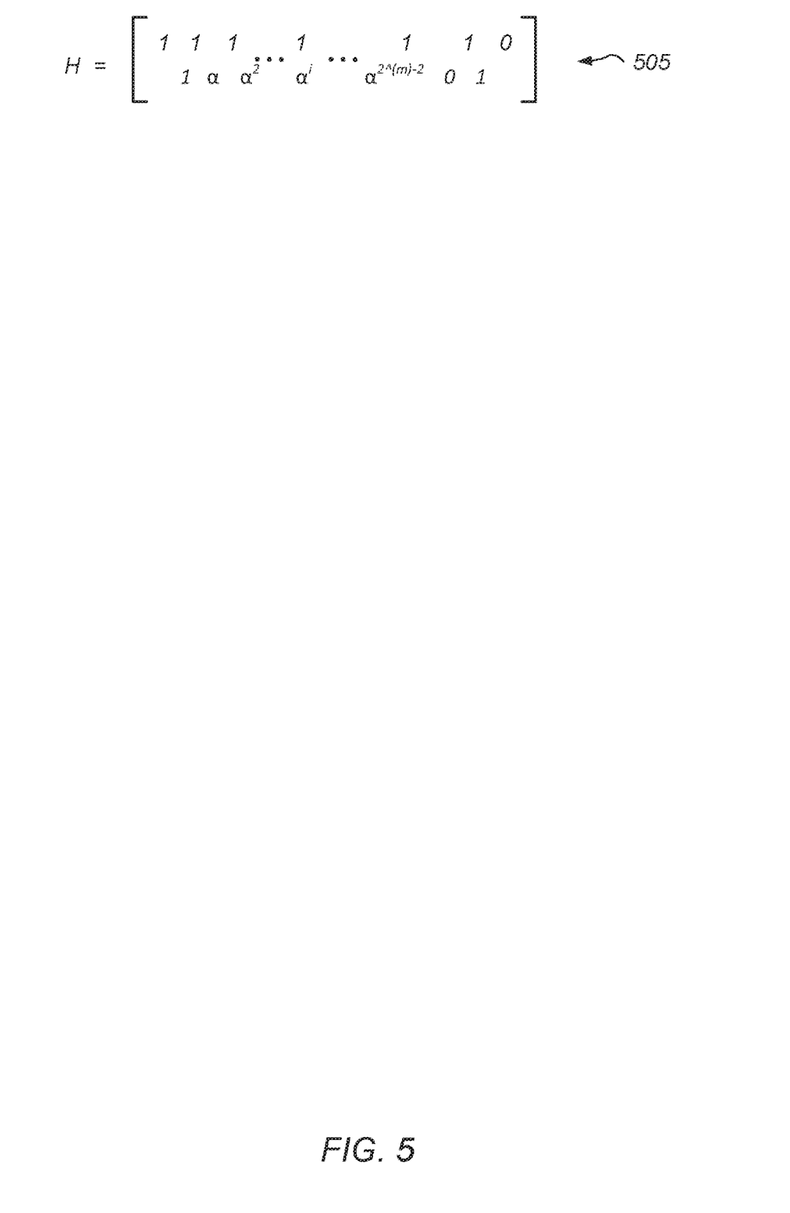
FIG. 5 is a parity check matrix for detecting and correcting single symbol errors.

Referring now to FIG. 5, one embodiment of a parity check matrix 505 for detecting and correcting single symbol errors is shown. In one embodiment, parity check matrix 505 is utilized to generated an (N, K) symbol ECC. An (N, K) symbol ECC has K data symbols and R=(N−K) check symbols. There is a set of R linearly independent equations over the Galois Field of $2^m$ elements that all code words have to satisfy. Let $X=(X_1, X_2, X_3, \ldots, X_N)$ be an N-tuple over $GF(2^m)$, where each $X_i$, for $1 \leq i \leq N$, is an element of $GF(2^m)$. The construction of an (N, K) symbol ECC is to specify a set of parameters $H_{ij}$ that are elements of $GF(2^m)$, for $1 \leq i \leq R$, and $1 \leq j \leq N$, such that every code word X satisfies the set of R linearly independent equations:

$$\Sigma(\text{for } j=1 \text{ to } N) H_{ij} \cdot X_j = 0$$

These equations are also referred to as the parity check equations of the ECC. The parity check equations can also be expressed as:

$$H \cdot X^t = 0$$

where $X^t$ is the transpose of X, and H is an R×N matrix with R rows and N columns. Matrix H is referred to as a parity check matrix of the ECC or as the ECC matrix. For an (N, K) symbol ECC with 2 check symbols, the matrix H will have two rows. For an ECC with 2 check symbols, R=N−K=2. In this case, there are two linearly independent equations over $GF(2^m)$ that all code words satisfy. The construction of an (N, N−2) symbol ECC involves specifying a set of parameters $H_{1j}$ and $H_{2j}$ that are elements of $GF(2^m)$, for $1 \leq j \leq N$, such that every code word X satisfies these two linearly independent equations:

$$\Sigma(\text{for } j=1 \text{ to } N) H_{1j} \cdot X_j = 0, \text{ and}$$

$$\Sigma(\text{for } j=1 \text{ to } N) H_{2j} \cdot X_j = 0$$

These two equations can be expressed in terms of an ECC matrix as:

$$H \cdot X^t = 0,$$

where $X^t$ is the transpose of X, and H is a 2×N matrix.

The error detecting and error correcting capability of an ECC depends on the specifications of the ECC matrix that defines the code. In a computing system or computing apparatus, ECC words are stored in and fetched out of memory. If a code word X is stored in a memory location and a corrupted N-tuple W is read from the same memory location, the difference between W and X is an N-tuple $E = (E_1, E_2, E_3, \ldots, E_N)$ that represents symbol errors in all N symbol positions. The relationship between W and X is defined as W=X+E. Substituting vector W for X into the equation ($H \cdot X^t = 0$) results in a 2-tuple S which is defined as:

$$S^t = H \cdot W^t = H \cdot (X+E)^t = H \cdot X^t + H \cdot E^t = 0 + H \cdot E^t = H \cdot E^t$$

Vector S is referred to as the syndrome of the received vector W. Since vector S depends only on error vector E but not on code word X, S is also referred to as the syndrome of error vector E. If an error syndrome S is zero, then it is assumed that there is no error in the received code word. If S is non-zero, this indicates the received code word includes one or more errors. The ability to detect and correct errors depends on the properties of the ECC matrix. To be able to detect all single symbol errors in a code word, all syndromes of single symbol errors have to be nonzero. To be able to detect and correct all single symbol errors in a code word, the syndromes of single symbol errors have to be nonzero and distinct. If each single symbol error has a unique syndrome, the position and the values of the symbol error can be identified from the associated unique syndrome of the symbol error. Once the position and the values of the symbol error are determined, the corrupted word can be corrected by the addition X=W+E.

Let α be a primitive element of $GF(2^m)$. Given a symbol size of m bits, an (N, N−2) single symbol error code of length $N=(2^m-1)$ can be constructed from the following parity check matrix:

$$H = |H_1 H_2 \ldots H_i \ldots H_N|$$

This H matrix is shown as matrix 505 in FIG. 5. Note that each column submatrix $H_i$ of H matrix 505 contains two elements of $GF(2^m)$. For a symbol size of 16 bits (m=16), a single symbol error correcting code with a code length $N=2^{16}+1$ and 2 check symbols (32 check bits) can be constructed from the H matrix 505. In one embodiment, a shortened code can be constructed by deleting most of the columns of the H matrix 505 so that the code length is 19 symbols. In other embodiments, a shortened code of other symbol lengths can be constructed using the H matrix 505.

Figure 6:
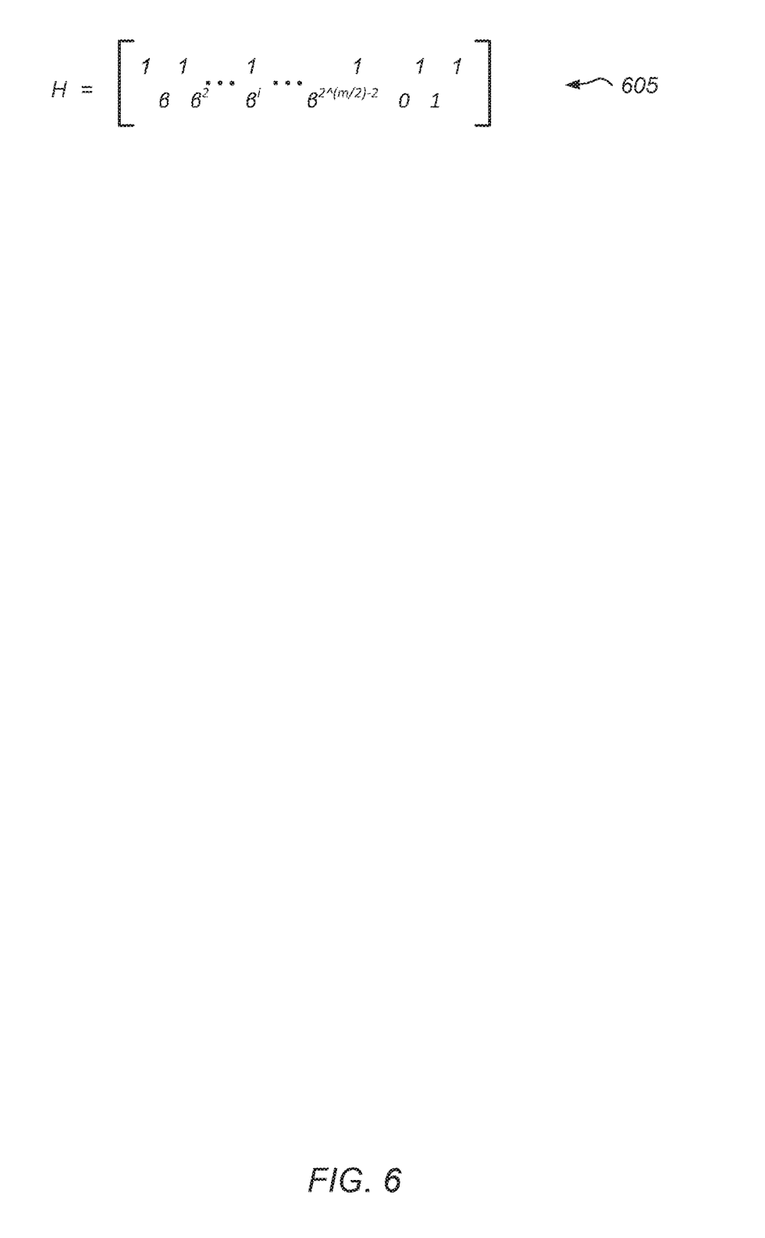
FIG. 6 is a parity check matrix for generating single symbol error correcting and double bit error detecting codes.

Turning now to FIG. 6, one embodiment of a parity check matrix 605 for generating single symbol error correcting and double bit error detecting codes is shown. An ECC capable of detecting all double bit errors in addition to detecting and correcting all single symbol errors is referred to as a single symbol error correcting and double bit error detecting code. Such a code will meet the previous conditions listed for a single symbol error correcting code as well meeting the condition that the syndrome of every two bit errors that are located in two different symbol positions is not zero and is not equal to the syndrome of any single symbol error.

In one embodiment, to construct a class of ECCs that meets these conditions, let m be a composite integer. For simplicity, it can be assumed that m is an even number. Then, $GF(2^{m/2})$ is a subfield of $GF(2^m)$. Letting $\alpha$ be a primitive element of $GF(2^m)$, and letting $\beta = \alpha\hat{}((2^m-1)/2^{m/2}-1) = \alpha\hat{}(2^{m/2}+1)$, then $\beta$ is a primitive element of $GF(2^{m/2})$. The sum or the product of two powers of $\beta$ (i.e., $\beta\hat{}i$ and $\beta\hat{}j$) is an element of $GF(2^{m/2})$. A Code A, with a symbol size of m, can be defined by the following parity check matrix:

$$H = |H_1 H_2 \ldots H_i \ldots H_N|$$

with the H matrix expanded as shown as matrix 605 in FIG. 6. Note that the second row of the parity check matrix (H) 605 consists of all of the elements of $GF(2^{m/2})$. The length of Code A is $2^{m/2}$ and the number of check symbols is 2. Code A is a shortened code of the code shown in matrix 505 (of FIG. 5). The maximum length of Code A is $N = 2^{m/2}$. A code of shorter length can be obtained by deleting columns from matrix 605.

Figure 7:
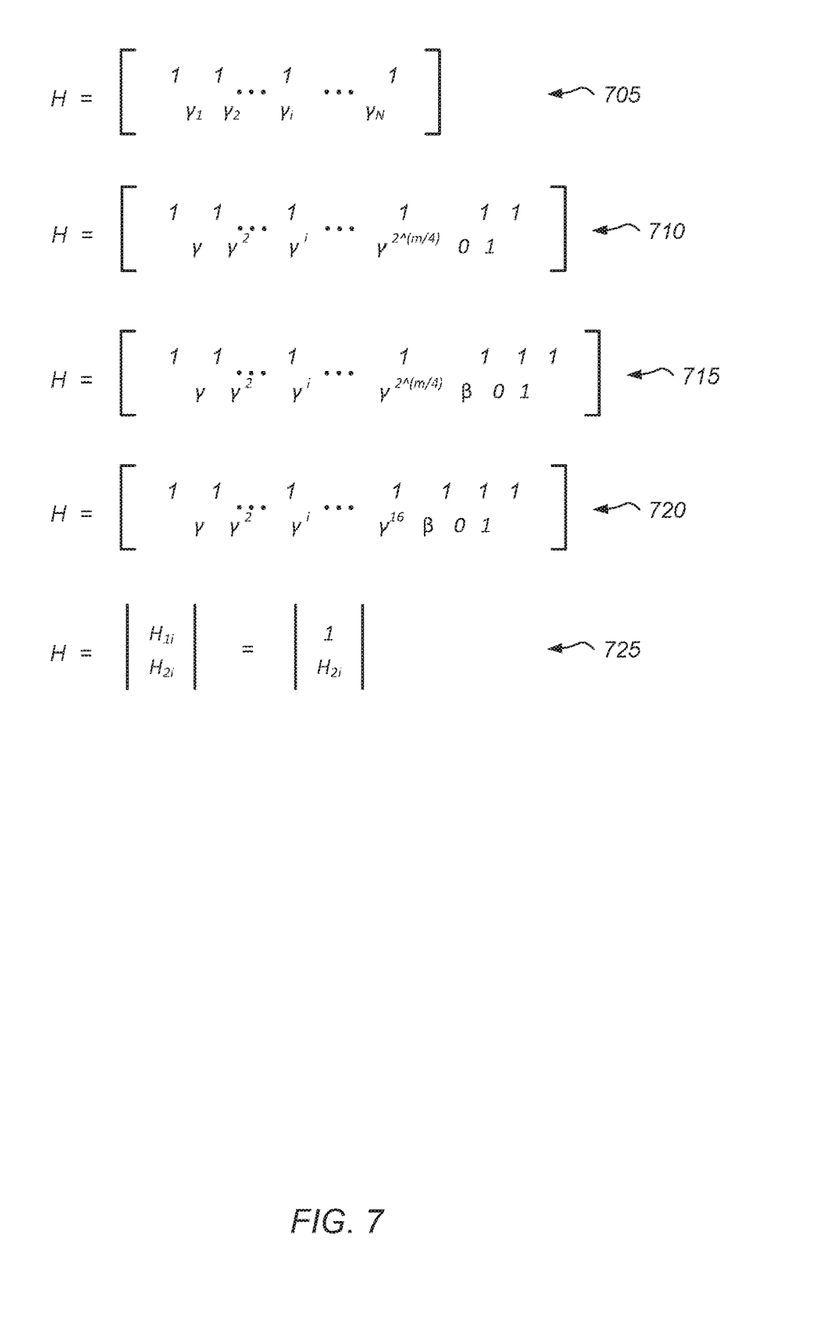
FIG. 7 is a code that is capable of correcting single symbol errors and correcting double bit errors.

Referring now to FIG. 7, one embodiment of a code that is capable of correcting single symbol errors and correcting double bit errors is shown. An ECC that is capable of detecting and correcting all single symbol errors and all double bit errors in every encoded code word is referred to as a single symbol error correcting and double bit error correcting code. A single symbol error correcting and double bit error correcting code is capable of correcting all double bit errors in every encoded code word if the code satisfies the conditions that the syndromes of all single symbol errors are non-zero and distinct, the syndromes of all double bit errors are distinct, and the syndrome of any double bit error is not equal to the syndrome of any single symbol error.

A class of single symbol error correcting and double bit error detecting codes is constructed by selecting a group of 2-tuples from the columns of matrix 605 to form the parity check matrix 705. It can be assumed that the code has a symbol size of m bits, where m is a multiple of 4. Letting $\gamma = \beta\hat{}(2^{m/4}-1)$, $\beta = \alpha\hat{}(2^{m/2}1)$, and $\alpha$ is a primitive element of $GF(2^m)$. It is noted that $\beta\hat{}(2^{m/2}-1) = 1$, and $\gamma\hat{}(2^{m/4}+1) = 1$. A code B is defined by the following parity check matrix:

$$H = |H_1 H_2 \ldots H_i \ldots H_N|$$

with the H matrix expanded as shown as matrix 705 in FIG. 7, and with matrix 710 including an alternate representation of matrix 705. The length of Code B is $N = 2^{m/4}+2$ symbols. It is noted that matrix 710 is a submatrix of matrix 605 (of FIG. 6).

For m=16, Code B has a maximum length of $2^{m/4}+2 = 18$ symbols. Accordingly, Code B is a (18, 16) single symbol error correcting and double bit error correcting code. To create a code with a length of 19 symbols, one column from the parity check matrix 605 of Code A is added to the parity check matrix 710 of Code B to create the parity check matrix 715. In one embodiment, the resultant matrix 715 is used as a parity check matrix for Code C.

In one embodiment, m=16, and $\alpha$ is a primitive element of $GF(2^m)$. For $\beta = \alpha\hat{}((2^m-1)/(2^{m/2}-1)) = \alpha\hat{}(2^{m/2}+1) = 257$, and with $\gamma = \beta\hat{}(2^{m/4}-1) = \beta^{15}$. The following parity check matrix is used to specify Code C:

$$H = |H_1 H_2 \ldots H_i \ldots H_l|$$

with the H matrix expanded as shown as matrix 720. In one embodiment, matrix 720 is utilized as the parity check matrix for Code C. Code C is a (19, 17) single symbol error correcting and double bit error detecting code. Code C is capable of correcting double bit errors that are not related to the $17^{th}$ symbol.

In one embodiment, the following description specifies a technique for encoding code words of Code C utilizing parity check matrix 720. Let $X = (X_1, X_2, X_3, \ldots X_{19})$ be a 19-tuple over $GF(2^{16})$, where each $X_i$, for $1 \leq i \leq 19$, is an element of $GF(2^{16})$. Vector X is a code word of Code C if $H \cdot X^t = 0$. Accordingly, X is a code word of Code C if:

$$X_1 + X_2 + X_3 + \ldots + X_{19} = 0, \text{ and}$$

$$\gamma X_1 + \gamma^2 X_2 + \gamma^3 X_3 + \ldots + \gamma^{16} X_{16} + \beta X_{17} + X_{19} = 0.$$

The $18^{th}$ and $19^{th}$ symbols are designated as check symbols. The data symbols $(X_1, X_2, X_3, \ldots, X_{17})$ are encoded to generate check symbols $X_1, X_2, X_3, \ldots, X_{19}$). From the above equations, $X_1, X_2, X_3, \ldots, X_{19}$ can be calculated as:

$$X_{19} \gamma X_1 + \gamma^2 X_2 + \gamma^3 X_3 + \ldots + \gamma^{16} X_{16} + \beta X_{17}$$

Then, $X_{18}$ is calculated as:

$$X_{18} = X_1 + X_2 + X_3 + \ldots X_{17} + X_{19}$$

It is noted that check symbol $X_{19}$ is calculated before $X_{18}$ according to the above equations. In another embodiment, a different equation can be utilized for the calculation of the check symbol $X_{18}$. This equation is the following:

$$X_{18} = (1+\gamma)X_1 + (1+\gamma^2)X_2 + (1+\gamma^3)X_3 + \ldots (1+\gamma^{16})X_{16} + (1+\beta)X_{17}$$

Various schemes can be utilized for decoding of code words encoded according to Code C. For example, let $X = (X_1, X_2, X_3, \ldots, X_{19})$ be a code word stored in memory and $W = (W_1, W_2, W_3, \ldots, W_{19})$ be the word retrieved from the memory location at which X was originally stored. The difference between X and W is the error vector $E = (E_1, E_2, E_3, E_{19})$. The decoding process involves generating the error vector E from the received word W. In one embodiment, for Code C, the decoding process is utilized to determine if there is a single symbol error, to locate the position and the value of the symbol error if there is a symbol error, to correct the symbol error, and/or to generate an uncorrectable error (UE) indicator for errors that are not single symbol errors.

As part of the decoding process, the syndrome $S = (S_1, S_2)$ is generated. In one embodiment, the syndrome is generated from the following equations:

$$S_1 = W_1 + W_2 + W_3 + \ldots + W_{19}$$

$$S_2 = \gamma W^1 + \gamma^2 W_2 + \gamma^3 W_3 + \ldots + \gamma^{16} W_{16} + \beta W_{17} + W_{19}$$

The properties of W, H, and X, specifically that $(W = X + E)$ and $(H \cdot X^t = 0)$, can be used to convert the above equations for the syndrome S. Accordingly, the syndrome S equations can be converted into the following equations:

$$S_1 = E_1 + E_2 + E_3 + \ldots + E_{19}$$

$$S_2 = \gamma E^1 + \gamma^2 E_2 + \gamma^3 E_3 + \ldots + \gamma^{16} E_{16} + \beta E_{17} + E_{19}$$

A column $H_i$ of the parity check matrix 720 can be expressed as the matrix 725. If a single symbol error is located at the i-th symbol position, then syndrome S can be expressed as $S_1=E_i$, and $S_2=H_{2i}·E_i$. Combining these two equations results in $S_2=H_{2i}·S_1$. This relationship between $S_1$ and $S_2$ is used to identify the symbol error location. In addition, $S_1$ is the error value.

Accordingly, in one embodiment, an algorithm for decoding a received word W includes the following: (1) Generate syndrome $S=(S_1, S_2)$ according to the above equations using the received word W as input. (2) If S is zero, the decoder declares that there is no error. (3) If S is nonzero, and $S_2=H_{2i}·S_1$ for an i, where 1≤i≤19, the decoder declares that there is a symbol error at symbol position i and the symbol error value is $S_1$. The symbol error is corrected by the addition $W_i+S_1$. If S is nonzero, and $S_2 \neq H_{2i}·S$ for all i, where 1≤i≤19, the decoder declares that there is an uncorrectable error (UE) in the code word.

In one embodiment, the primitive polynomial $P(x)=1+x^4+x^{13}+x^{15}+x^{16}$ is used to define all elements of $GF(2^{16})$. In other embodiments, other primitive polynomials can be utilized to define the elements of $GF(2^{16})$. Let α be a root of p(x). All nonzero elements of $GF(2^{16})$ can be expressed in powers of α or in binary 16-tuples (16-bit vectors).

It is noted that for other codes with other number of data words, check symbols, and/or other numbers of bits per symbol, the encoding and decoding process described above can be adjusted to match the particular parameters of the code words.

Figure 8:
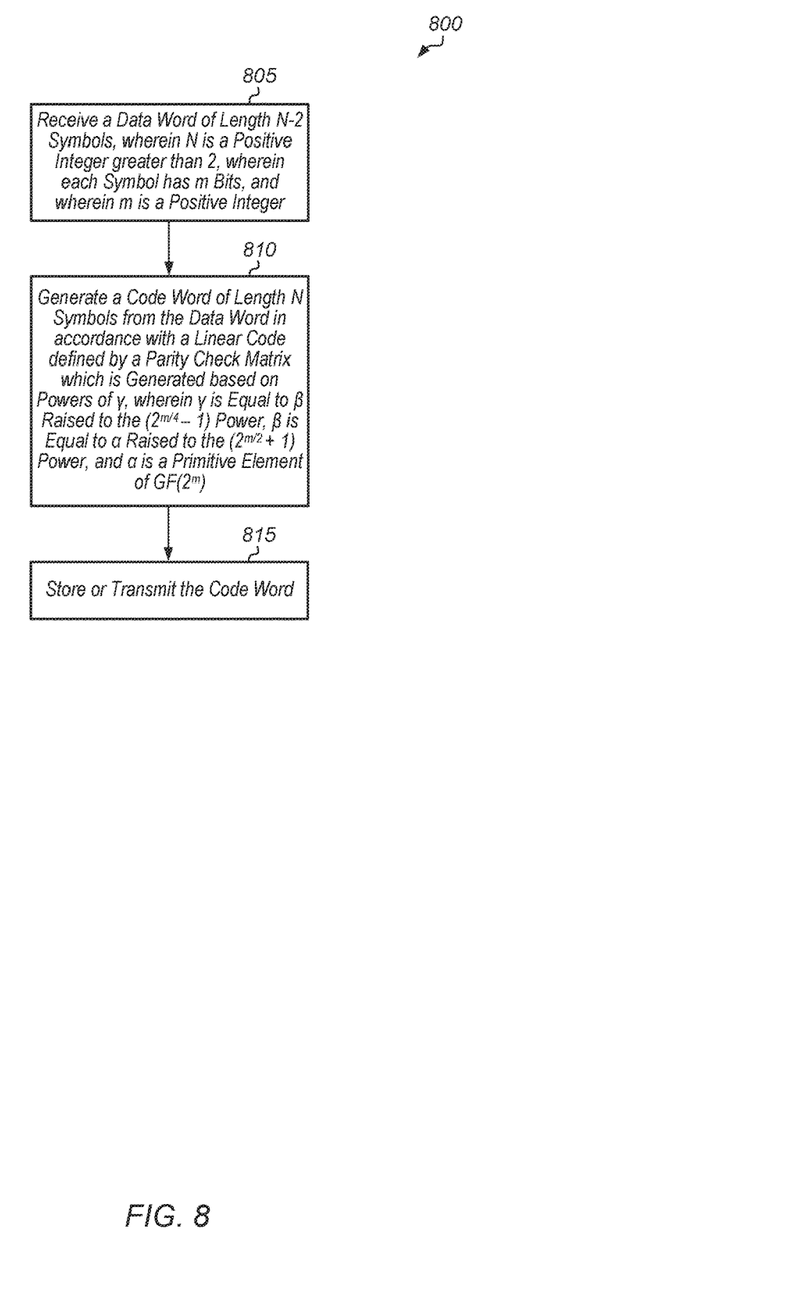
FIG. 8 is a generalized flow diagram illustrating one embodiment of a method for encoding data words with an error correction code (ECC).
Figure 9:
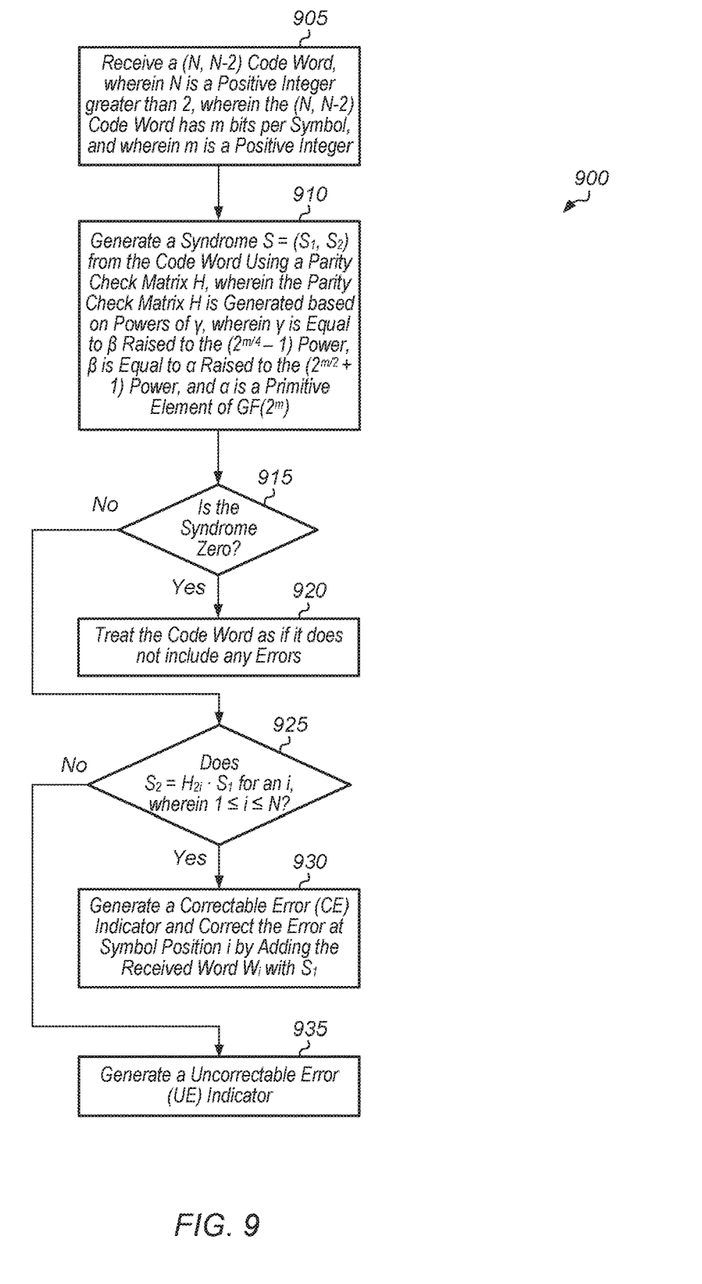
FIG. 9 is a generalized flow diagram illustrating one embodiment of a method for checking a code word for errors.

Turning now to FIG. 8, one embodiment of a method 800 for encoding data words with an error correction code (ECC)) is shown. For purposes of discussion, the steps in this embodiment and those of FIG. 9 are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 800.

A system receives a data word of length N−2 symbols, where N is a positive integer greater than 2, where each symbol has m bits, and where m is positive integer (block 805). Next, the system generates a code word of length N symbols from the data word in accordance with a linear code defined by a parity check matrix which is generated based on powers of γ, where γ is equal to β raised to the $(2^{m/4}-1)$ power, β is equal to a raised to the $(2^{m/2}+1)$ power, and α is a primitive element of $GF(2^m)$ (block 810). In other words, in block 810, the system generates two check symbols from the data word using the parity check matrix. A linear code is defined as an error-correcting code for which any linear combination of code words is a code word. In one embodiment, the parity check matrix utilized in block 810 is parity check matrix 710 (of FIG. 7). In another embodiment, the parity check matrix utilized in block 810 is parity check matrix 715. In other embodiments, other suitable parity check matrices which are based on powers of γ and/or β can be utilized. Then, the system stores or transmits the code word (block 815). After block 815, method 800 ends.

Referring now to FIG. 9, one embodiment of a method 900 for checking a code word for errors is shown. A system receives a (N, N−2) code word, where the (N, N−2) code word has m bits per symbol, where N is a positive integer greater than 2, and where m is a positive integer (block 905). Next, the system generates a syndrome $S=(S_1, S_2)$ from the code word using a parity check matrix H, where the parity check matrix H is generated based on powers of γ, where γ is equal to β raised to the $(2^{m/4}-1)$ power, where β is equal to a raised to the $(2^{m/2}+1)$ power, and where a is a primitive element of $GF(2^m)$ (block 910). It is noted that $S_1$ can be referred to as the first syndrome vector and $S_2$ can be referred to as the second syndrome vector. If the syndrome is zero (conditional block 915, "yes" leg), then the system treats the code word as if it does not include any errors (block 920). If the syndrome is non-zero (conditional block 915, "no" leg), then the system determines if $S_2=H_{2i}·S_1$ for an i, where 1≤i≤N, (conditional block 925). In other words, the system determines if the first syndrome vector multiplied by a given element "i" of a second row vector of the parity check matrix "H" is equal to the second syndrome vector.

If $S_2=H_{2i}·S_1$ for an i, where 1≤i≤N (conditional block 925, "yes" leg), the system generates a correctable error (CE) indicator and the system corrects the error at symbol position i by adding the received word $W_i$ with $S_1$ (block 930). In other words, the system corrects the error by adding the first syndrome vector to a given symbol of the received code word, wherein a location of the given symbol within the received code word corresponds to a location of the given element "i" of the second row vector of the parity check matrix "H". If $S_2·H_{2i}·S_1$ for any i, where 1≤i≤N (conditional block 925, "no" leg), the system generates an uncorrectable error (UE) indicator (block 935). In other words, if the first syndrome vector multiplied by an element "i" of the second row vector of the parity check matrix is not equal to the second syndrome vector for any element "i" of the second row vector of the parity check matrix "H", then the system generates the UE indicator. After blocks 930 and 935, method 900 ends.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system for performing error detection and correction, the system comprising:
   a memory device; and
   an encoder coupled to the memory device;
   a parity check matrix, wherein the parity check matrix is generated based on powers of γ, wherein:
   γ is equal to β raised to the $(2^{m/4}-1)$ power;
   β is equal to a raised to the $(2^{m/2}+1)$ power; and
   α is a primitive element of a Galois Field of $2^m$ elements;
   wherein the encoder comprises circuitry configured to:
   receive a data word of length N−2 symbols, wherein N is a positive integer greater than 2, each symbol has m bits, and m is positive integer; and
   generate a code word of length N symbols from the data word based on the parity check matrix;
   store the code word in the memory;

a decoder comprising circuitry configured to:
  receive the code word from the memory;
  generate a syndrome by multiplying the code word by the parity check matrix, wherein the syndrome comprises a first syndrome vector and a second syndrome vector; and
  responsive to determining the syndrome is non-zero:
    generate a correctable error indicator responsive to determining that the first syndrome vector multiplied by a given element of a row vector of the parity check matrix is equal to the second syndrome vector; and
    correct an error in the received code word by adding the first syndrome vector to a given symbol of the received second code word, wherein a location of the given symbol within the received second code word corresponds to a location of the given element of the second row vector of the parity check matrix.

2. The system as recited in claim 1, wherein the circuitry of the encoder is configured to generate 2 check symbols from N−2 data symbols based on the parity check matrix.

3. The system as recited in claim 1, wherein the circuitry of the encoder is further configured to generate the code word in accordance with a linear code defined by a subset of columns from the parity check matrix.

4. The system as recited in claim 1, wherein the code word achieves single-symbol error correction and double-bit error detection with two check symbols per code word.

5. The system as recited in claim 1, wherein m is 16.

6. The system as recited in claim 3, wherein:
N is 17; and
the linear code is a (19,17) code.

7. The system as recited in claim 3, wherein:
N is 16; and
the linear code is a (18,16) code; and
code words achieve single-symbol error correction and double-bit error correction.

8. The system as recited in claim 1, wherein the received code word has a length of N symbols; and
the circuitry of the decoder is further configured to generate the syndrome by multiplying the received code word by the parity check matrix.

9. The system as recited in claim 1, wherein responsive to determining the syndrome is non-zero and responsive to determining that for each element of the second row vector of the parity check matrix, the first syndrome vector multiplied by the respective element of the second row vector of the parity check matrix is not equal to the second syndrome vector, the circuitry of the decoder is configured to generate an uncorrectable error indicator.

10. A method for use in a computing device, the method comprising:
storing in a memory device, a parity check matrix, wherein the parity check matrix is generated based on powers of $\gamma$, wherein:
  $\gamma$ is equal to $\beta$ raised to the $(2^{m/4}-1)$ power;
  $\beta$ is equal to a raised to the $(2^{m/2}+1)$ power; and
  $\alpha$ is a primitive element of a Galois Field of $2^m$ elements;
receiving, by an encoder comprising circuitry, a data word of length N−2 symbols, wherein N is a positive integer greater than 2, each symbol has m bits, and m is positive integer;
generating, by the encoder, a code word of length N symbols from the data word based on a parity check matrix;
storing the code word in a memory device;
receiving, by a decoder, the code word from the memory;
generating, by the decoder comprising circuitry, a syndrome by multiplying the code word by the parity check matrix, wherein the syndrome comprises a first syndrome vector and a second syndrome vector; and
responsive to determining the syndrome is non-zero, the circuitry of the decoder:
  generating a correctable error indicator responsive to determining that the first syndrome vector multiplied by a given element of a row vector of the parity check matrix is equal to the second syndrome vector; and
  correcting an error in the received code word by adding the first syndrome vector to a given symbol of the received second code word, wherein a location of the given symbol within the received second code word corresponds to a location of the given element of the second row vector of the parity check matrix.

11. The method as recited in claim 10, further comprising generating 2 check symbols from N−2 data symbols based on the parity check matrix.

12. The method as recited in claim 10, further comprising generating a code word of length N symbols from the data word in accordance with a linear code defined by a subset of columns from the parity check matrix.

13. The method as recited in claim 10, wherein the code word achieves single-symbol error correction and double-bit error detection with two check symbols per code word.

14. The method as recited in claim 10, wherein m is 16.

15. The method as recited in claim 12, wherein:
N is 17; and
the linear code is a (19,17) code.

16. The method as recited in claim 12, wherein:
N is 16;
the linear code is a (18,16) code; and
code words achieve single-symbol error correction and double-bit error correction.

17. The method as recited in claim 10,
wherein the received code word has a length of N symbols; and the method comprises
generating the syndrome by multiplying the received code word by the parity check matrix, wherein the syndrome comprises a first syndrome vector and a second syndrome vector.

18. The method as recited in claim 10, wherein responsive to determining the syndrome is non-zero and responsive to determining that for each element of the second row vector of the parity check matrix, the first syndrome vector multiplied by the respective element of the second row vector of the parity check matrix is not equal to the second syndrome vector, the method further comprising generating an uncorrectable error indicator.

19. An apparatus comprising:
a memory device; and
a code word of length N symbols stored in the memory device, wherein N is a positive integer greater than 2, each symbol has m bits, and m is positive integer;
a parity check matrix, wherein the parity check matrix is generated based on powers of $\gamma$, wherein:
  $\gamma$ is equal to $\beta$ raised to the $(2^{m/4}-1)$ power;
  $\beta$ is equal to a raised to the $(2^{m/2}+1)$ power; and
  $\alpha$ is a primitive element of a Galois Field of $2^m$ elements;

a decoder;
wherein the decoder comprises circuitry configured to:
receive the code word from the memory device;
generate a syndrome by multiplying the code word by a parity check matrix, wherein the syndrome comprises a first syndrome vector and a second syndrome vector; and
responsive to determining the syndrome is non-zero:
generate a correctable error indicator responsive to determining that the first syndrome vector multiplied by a given element of a row vector of the parity check matrix is equal to the second syndrome vector; and
correct an error in the received code word by adding the first syndrome vector to a given symbol of the received second code word, wherein a location of the given symbol within the received second code word corresponds to a location of the given element of the second row vector of the parity check matrix.

20. The apparatus as recited in claim 19, wherein responsive to determining the syndrome is equal to zero, the circuitry of the decoder is configured to declare that the code word includes no errors.

21. The apparatus as recited in claim 19, wherein the circuitry of the decoder is configured to utilize the syndrome to correct a single-symbol error responsive to determining the syndrome is non-zero.

22. The apparatus as recited in claim 19, wherein the circuitry of the decoder is configured to correct single-symbol errors in the code word and detect double-bit errors in the code word.

23. The apparatus as recited in claim 19, wherein responsive to determining the syndrome is non-zero and responsive to determining that for each element of the second row vector of the parity check matrix, the first syndrome vector multiplied by the respective element of the second row vector of the parity check matrix is not equal to the second syndrome vector, the circuitry of the decoder is configured to generate an uncorrectable error indicator.

24. The apparatus as recited in claim 19, wherein the code word is encoded in accordance with a linear code defined by a subset of columns from the parity check matrix, wherein:
N is 17; and
the linear code is a (19,17) code.

* * * * *

UNITED STATES PATENT AND TRADEMARK OFFICE
CERTIFICATE OF CORRECTION

PATENT NO. : 10,291,258 B2
APPLICATION NO. : 15/605310
DATED : May 14, 2019
INVENTOR(S) : Chin-Long Chen It is certified that error appears in the above-identified patent and that said Letters Patent is hereby corrected as shown below:

On the Title Page

Item (57) Abstract:

Lines 5-6, please delete "m is positive integer" and substitute -- m is a positive integer --.

Line 10, please delete "$\beta$ is equal to a raised" and substitute -- $\beta$ is equal to $\alpha$ raised --.

In the Specification

Column 2, Line 21, please delete "m is positive integer" and substitute -- m is a positive integer --.

Column 9, Line 40, please delete "m is positive integer" and substitute -- m is a positive integer --.

Column 9, Line 45, please delete "$\beta$ is equal to a raised" and substitute -- $\beta$ is equal to $\alpha$ raised --.

Column 9, Lines 66-67, please delete "$\beta$ is equal to a raised" and substitute -- $\beta$ is equal to $\alpha$ raised --.

In the Claims

Column 10, Claim 1, Line 58, please delete "$\beta$ is equal to a raised" and substitute -- $\beta$ is equal to $\alpha$ raised --.

Column 10, Claim 1, Line 64, please delete "m is positive integer" and substitute -- m is a positive integer --.

Column 11, Claim 10, Line 58, please delete "$\beta$ is equal to a raised" and substitute -- $\beta$ is equal to $\alpha$ raised --.

Signed and Sealed this
First Day of October, 2019

Andrei Iancu
*Director of the United States Patent and Trademark Office*

Column 11, Claim 10, Lines 63-64, please delete "m is positive integer" and substitute -- m is a positive integer --.

Column 12, Claim 19, Line 61, please delete "m is positive integer" and substitute -- m is a positive integer --.

Column 12, Claim 19, Line 65, please delete "β is equal to a raised" and substitute -- β is equal to α raised --.